United States Patent [19]

Harada

[11] Patent Number: 4,492,980

[45] Date of Patent: Jan. 8, 1985

[54] SOLID STATE IMAGE-SENSING DEVICE

[75] Inventor: Nozomu Harada, Yokohama, Japan

[73] Assignee: Tokyo Shibaura Denki Kabushiki Kaisha, Kawasaki, Japan

[21] Appl. No.: 297,968

[22] Filed: Aug. 31, 1981

[30] Foreign Application Priority Data

Sep. 10, 1980 [JP] Japan ............................ 55-124510

[51] Int. Cl.³ .................... H04N 3/14; H04N 5/30
[52] U.S. Cl. ................................ 358/213; 358/167
[58] Field of Search ............ 358/213, 241, 221, 167, 358/163, 212

[56] References Cited

U.S. PATENT DOCUMENTS

| 4,293,877 | 10/1981 | Tsunekawa | 358/213 |
| 4,302,779 | 11/1981 | Inque | 358/213 |
| 4,317,134 | 2/1982 | Woo | 358/213 |
| 4,322,753 | 3/1982 | Ishihara | 358/213 |

OTHER PUBLICATIONS

TV-Compatible Schottky Barrier Monolithic IRCCD Focal Plane, by Skolnik et al., APIE vol. 197, Modern Utilization of Infrared Technology V (1979).
W. F. Kosonocky and D. J. Sauer: RCA Review, vol. 40, pp. 241–277, Sep. 1979.

*Primary Examiner*—Tommy P. Chin
*Attorney, Agent, or Firm*—Oblon, Fisher, Spivak, McClelland & Maier

[57] ABSTRACT

A solid state image-sensing device which comprises an image-sensing area formed of a plurality of matrix-arranged cells exposed to an introduced image light and an optical black connected to a readout section in parallel relationship with the image-sensing area. An image light is prevented from entering the optical black. Only noise charges (dark current charges) sent forth from the optical black are transferred to a control circuit. A gate electrode control signal for eliminating charges whose amount corresponds to that of the noise charges from the total charges collected in the storage regions of the matrix-arranged cells of the image-sensing area is produced by a control circuit. The gate electrode control signal is supplied to a gate electrode positioned between the photosensing section and vertical transfer section of the cells of the image-sensing area. A potential well lying under the gate electrode has its depth controlled by the gate electrode control signal. At first, a charge whose amount is substantially equal to that of a light-generated signal charge stored in the storage region of the image-sensing area is transferred to a vertical transfer section. After elimination of the noise charges, the remaining charges are returned at least once to the photosensing sections of the respective cells to be held in the storage regions of the photosensing sections of the cells for a prescribed length of time.

13 Claims, 20 Drawing Figures

SOLID STATE IMAGE-SENSING DEVICE

BACKGROUND OF THE INVENTION

This invention relates to an image-sensing device, and more particularly to a solid state image-sensing device which enables an image signal corresponding to the illumination by an introduced light to be read out with a relatively slow speed.

Recently a picture-photographing apparatus has been developed which can pick up an optical image without applying a sensitized film containing silver. This picture-photographing apparatus is used in substitution for the conventional photographic camera device. The picture-photographing apparatus contains a solid state area image-sensing device, which generates an image electric signal corresponding to the luminosity of an introduced light. After amplified, the image signal is transmitted or transferred to signal-recording means, for example, the ordinary voice tape recorder. The image electric signal is recorded on a magnetic tape of a tape recorder by the known process.

The reason why a voice tape recorder is applied as means for recording an output image signal from the solid state image-sensing device is that the picture-photographing apparatus can be reduced in size, thereby decreasing its power consumption and manufacturing cost.

Since, however, a certain limitation is imposed on the acceleration of the running speed of a magnetic tape of a tape recorder, an image signal can not be recorded on the magnetic tape with a high speed. Consequently, a solid state image-sensing device held in the picture-photographing apparatus is so arranged as to release signal charges generated in accordance with the illumination by an introduced light from a storage section at such a low speed as consumes scores of seconds per discharge. Where signal charges are released from the storage section at the above-mentioned low speed, then the signal charges are retained in the storage section for a longer time. This event leads to an increase in the amount of noise charges, for example, undesired thermally generated dark current charged in the storage section, and consequently the percentage of dark current charges mixed with optically generated signal charges corresponding to an image signal. Dark current charge behaves as noises resulting from, for example, shading, irregularities and scars appearing in a reproduced image. Therefore, an increased content of dark current in image signal charges gives rise to objectionable events such as a decline in the dynamic range of a picture-photographing apparatus and the deterioration of a picture quality.

Dark current charge originates with a different cause from that by which an optically generated signal charge is produced. However, the dark current charge has substantially the same physical properties, (for example, polarity) as the optically generated signal charge, presenting difficulties in separating a dark current charge from an optically generated signal charge. Moreover, the dark current charge intricately changes with various factors such as time, ambient temperature and the site at which the dark current is generated. This fact makes it more difficult to separate the dark current charge from the optically generated signal charge.

To eliminate the above-mentioned difficulties, therefore, cooling means has hitherto been provided in the picture-photographing apparatus in order to restrict or prevent the growth of a dark current charge. Provision of the cooling means indeed attains the object of limiting or suppressing the generation of the dark current charge, but is still accompanied with the drawbacks that a picture-photographing apparatus has a complicated arrangement and increases in size, cost and power consumption.

To resolve the aforesaid difficulties, it may be contemplated to apply the process of providing memory means in the picture-photographing apparatus in addition to an image sensor, transmitting an optically generated signal charge corresponding to an output image signal from the image sensor at high speed to the memory means and later, as need arises, read out the optically generated signal charge from the memory means. In this case, however, it is necessary to enlarge the capacity of the memory means in accordance with a number of unit cells of which the image sensor is formed. Consequently, the above-mentioned process still has the drawbacks that the memory means has an enlarged size and complicated arrangement, increasing the cost of manufacturing a picture-photographing apparatus.

SUMMARY OF THE INVENTION

It is accordingly the object of this invention to provide a solid state image-sensing device which, even when an image signal is read out at a low speed, can reduce or prevent the growth of noises in a reproduced image due to the occurrence of dark current charge, thereby elevating the quality of a reproduced image.

To attain the above-mentioned object, this invention provides a solid state image-sensing device, in which a group of matrix-arranged cells is provided. Each of the cells includes means for generating signal charges corresponding to the luminosity of an introduced light, and means which forms a potential well and stores therein mixed charges consisting of the signal charges produced by the signal charge-generating means and unnecessary noise charges. Said solid state image-sensing device also comprises detection means for detecting amount of the noise charges stored in the charge-storing means and issuing a first electrical signal corresponding to the detected amount of the noise charges, elimination means for eliminating first charges whose amount correspond to the noise charges detected by the detection means from the mixed charges stored in said charge-storing means, and readout means connected at least to the matrix-arranged cell group for reading out an amount of second or remaining portion of the mixed charges after removal of the first charges. When the unnecessary noise charges are generated in the cell group and mixed with the signal charges, the charges whose amount correspond to the noise charges are removed from the charge-storing means by the elimination means. Consequently, noise is eliminated, and substantially equal charges to the signal charges can be presented. It is also possible to elevating the quality of a reproduced image, even when image signals are read out at a low speed.

DETAILED DESCRIPTION OF THE PREFERRED EMBODIMENT

Figure 1:
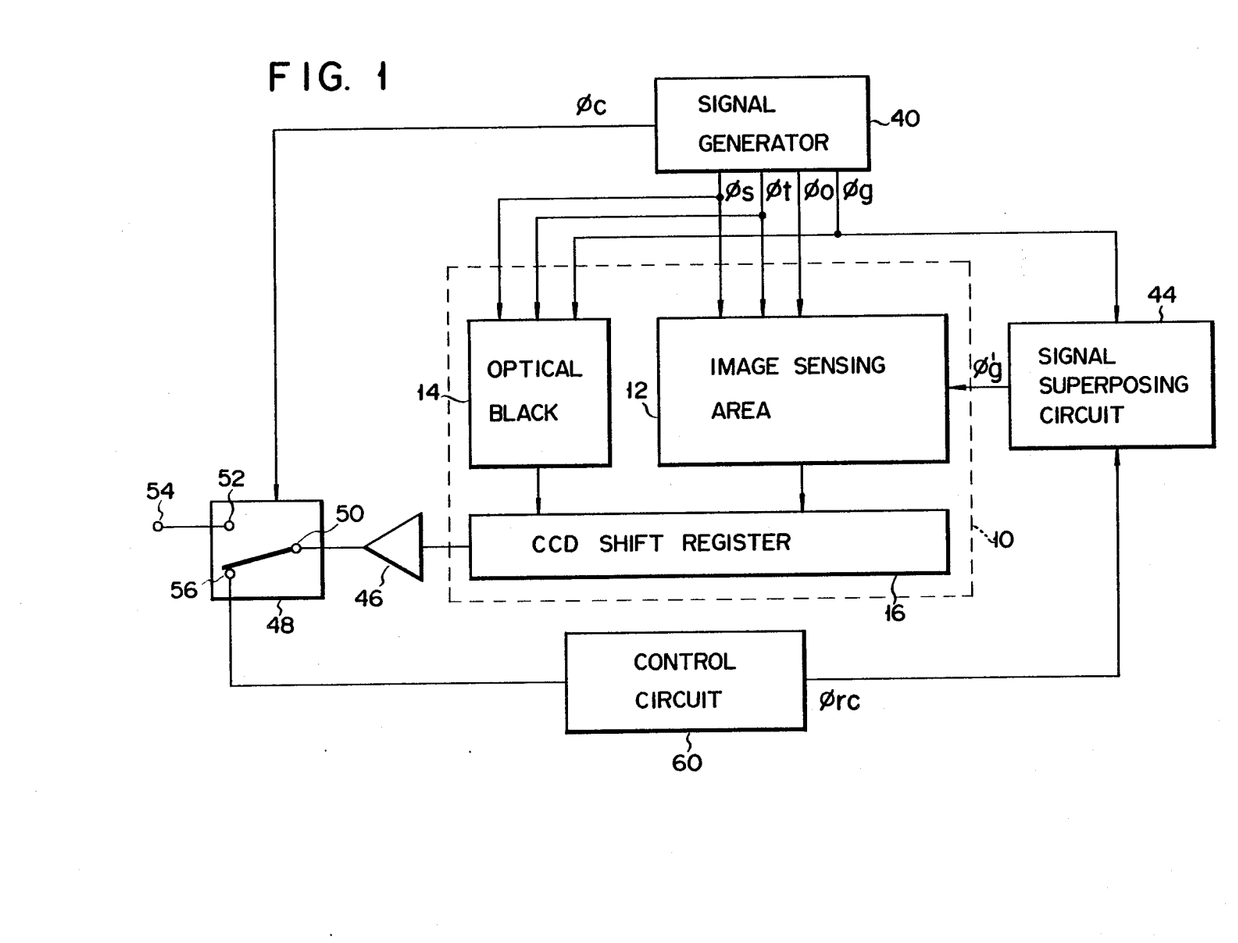
FIG. 1 is a schematic block circuit diagram of a solid state area image-sensing device according to a first embodiment of this invention.
Figure 2:
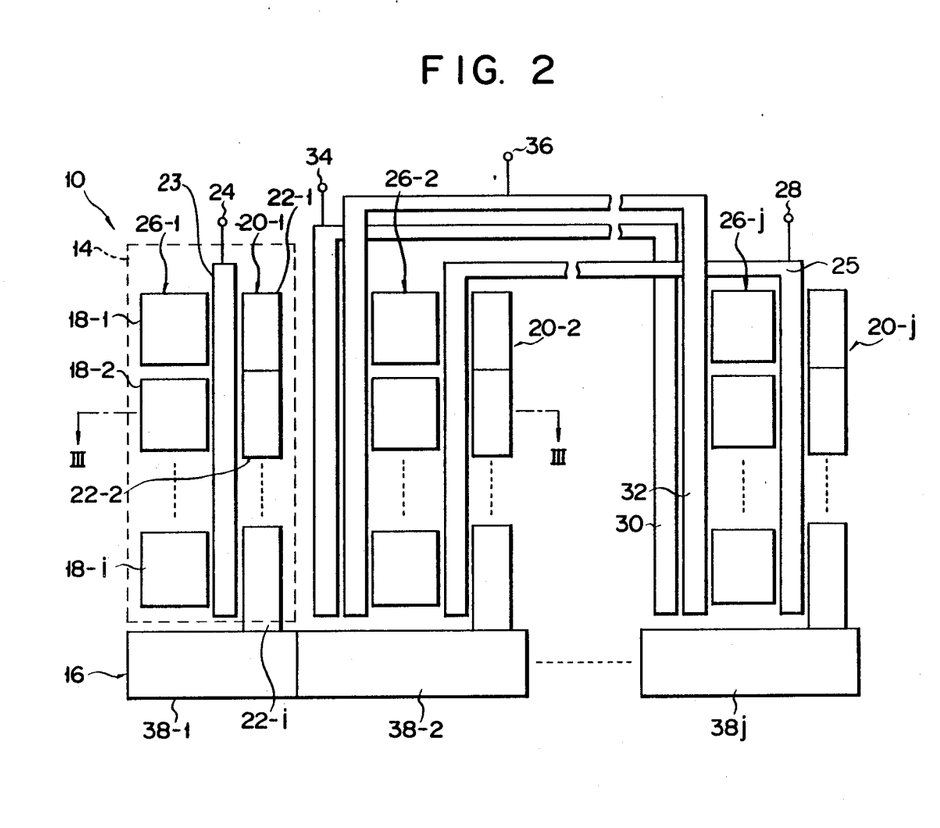
FIG. 2, shows the arrangement of an image sensor used with the solid state area image-sensing device of the invention.
Figure 3:
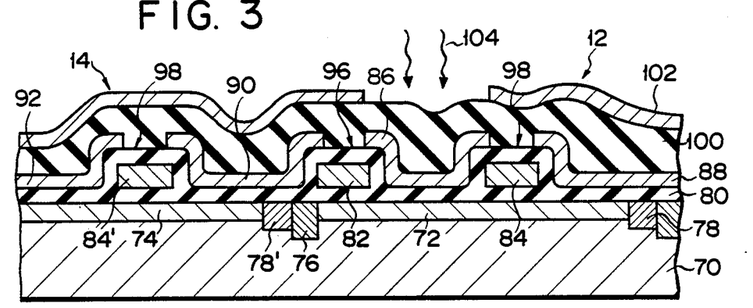
FIG. 3 is a sectional view on line III—III of the image sensor of FIG. 1.

FIG. 1 is a block circuit diagram of an image-sensing device according to one embodiment of this invention. An area image sensor 10 (enclosed in broken lines) comprises an image-sensing area 12, optical black 14 and horizontal transfer section 16 (CCD shift register). The area image sensor 10 is an interline transfer CCD image sensor whose details are indicated in FIG. 2. Referring to FIG. 2, a large number of photosensing sections which generate and store image signals corresponding to the luminosity of an introduced light are formed on a wafer (not shown) in the matrix form. An i number (a positive integer) of photosensing sections 18-1, 18-2, ..., 18-i are arranged in the columnar direction. These photosensing sections respectively have a plurality of (for example, two) picture elements as later described (FIGS. 5A to 7E). The CCD transfer section 20-1 which is formed of an i number of transfer elements 22-1, 22-2, ..., 22-i is positioned in the columnar direction close to a group of the photosensing sections 18-1 18-2, ..., 18-i on one side. The CCD transfer section 20-1 is used to read out optical signal charges from the storage regions of said photosensing sections 18-1, 18-2, ..., 18-i. The transfer elements 22-1, 22-2, ..., 22-i are respectively set opposite to the photosensing sections 18-1, 18-2, ..., 18-i. An electrode 23 provided with a signal input terminal 24 is disposed between the group of the photosensing sections 18-1, 18-2, ..., 18-i and the CCD transfer section (hereinafter referred to as "the vertical transfer section") 20-1. The photosensing sections 18-1, 18-2, ..., 18-i collectively constitute a first photosensing group 26-1. Other photosensing groups are each formed of the same photosensing sections 18-1, 18-2, ..., 18-i. The photosensing groups total a number of j (a positive integer). The j number of photosensing groups are arranged parallel to each other in the row direction. Further, a j number of vertical transfer groups 20-1, 20-2, ..., 20-j are provided to match the sensing groups 26-1, 26-2, ..., 26-j. Another electrode 25 is formed of a horizontal common member connected to a plurality of vertical members. Each of these vertical members extends between one of the photosensing groups 26-2, ..., 26-j and the corresponding one of the vertical transfer sections 20-2, ..., 20-j. The above-mentioned electrodes 23, 25 act as gate electrodes for controlling the delivery of charges stored in the storage regions of the photosensing groups 26-1, 26-2, ..., 26-j to the corresponding transfer sections 20-1, 20-2, ..., 20-j. The gate electrode 25 is connected to a gate signal input terminal 28. The first photosensing group 26-1 is purposely prevented from receiving a light by the later described process (FIG. 3). Consequently, the gate electrode 23 extending between the first photosensing group 26-1 and the first vertical transfer section 20-1 produces the optical black 14 of FIG. 1.

An overflow drain 30 is provided on the opposite side of each of the photosensing groups 26-2, ..., 26-j other than the first photosensing groups to that on which the corresponding vertical transfer section is set. There is provided an electrode 32 which is formed of a horizontal common member connected to a plurality of vertical members. Each of these vertical members is disposed between the overflow drain 30 and the corresponding one of the photosensing groups 26-2, ..., 26-j. The electrode 32 acts as an overflow control electrode to transmit or transfer a prescribed amount of a signal charge from the photosensing groups 26-2, ..., 26-j to the overflow drain 30. The overflow drain 30 is connected to a signal input terminal 34, and the overflow control electrode is connected to a signal input terminal 36. The vertical transfer sections 20-1, 20-2, ..., 20-j are connected to the other transfer section, that is, the CCD shift register 16 of FIG. 1, which is formed of a plurality of (for example, a j number of) transfer elements 38-1, 38-2, ..., 38-j connected in series in the row direction. The transfer elements 38-1, 38-2, ..., 38-j correspond to the vertical transfer sections 20-1, 20-2, ..., 20-j. Therefore, dark current charge thermally generated in the photosensing group 26-1 constituting the optical black 14 and charges produced in the other photosensing groups 26-2, ..., 26-j which are supplied with a light are delivered to the vertical transfer sections 20-1, 20-2, ..., 20-j through the corresponding gate electrodes 23, 25. Later, both of the above-mentioned charges are conducted through the vertical transfer sections 20-1, 20-2, ..., 20-j to the horizontal transfer section or CCD shift register 16. The charges are carried through the CCD shift register 16 and are sent forth at an output section (or amplifier) 46 (FIG. 1). The transfer of the aforesaid charge is carried out in response to a clock signal (not shown) having a radio frequency of about 7.16 MHz.

The image sensor arranged as described above is connected to a signal generator 40 (FIG. 1). Namely, the signal generator 40 supplies a signal φs for controlling the potential of the storage region and transfer control signal φt to the image-sensing area 12 and optical black 14 both included in the image sensor 10. The signal generator 40 further sends forth an overflow control signal φo, which in turn is conducted to the overflow control electrode 32 (FIG. 2) included in the image-sensing area 12. The signal generator 40 also produces a gate signal φg for controlling the potential of the gate electrode 24 (FIG. 2). The gate signal φg is supplied to the terminal 24 of the gate electrode 23 included in the optical black 14 and also to one input terminal of a signal-superposing circuit 44.

The output terminal of the CCD shift register 16 is connected to an input terminal 50 of the known changeover switch 48 through, for example, the known amplifier 46. One output terminal 52 of the changeover switch 48 is connected to an image signal output terminal 54 of this image sensor 10. The other output terminal 56 is connected to the other input terminal of the signal-superposing circuit 44 through a charge release control circuit 60. The operation of the changeover switch 48 is changed over in response to a switch changeover signal $\phi c$ sent forth from the signal generator 40. As a result, an output signal from the amplifier 46 is selectively supplied to the image signal output terminal 54 and charge release control circuit 60. This charge release control circuit is formed of a signal converter which issues a charge-releasing instruction corresponding to an output signal from the amplifier 46 which has been transmitted through the known operation circuit and switch 48. The signal converter sends forth an output signal corresponding to a signal transmitted through the changeover switch 48 in accordance with a prescribed input-output characteristic. The output signal is delivered to the signal superposing circuit 44 as a charge release control signal $\phi rc$. The signal-superposing circuit superposes the charge release control signal $\phi rc$ and a gate signal $\phi g$ from the signal generator 40 on each other to produce a new gate signal $\phi g'$. This new gate signal $\phi g'$ is supplied to the terminal 28 of the gate electrode 25 of the image-sensing area 12.

FIG. 3 is a sectional view on line III—III of the area image sensor 10 of FIG. 2. N+ layers 72, 74 are formed by doping an N-type impurity on a prescribed region of the surface of a semiconductor substrate 70 of, for example, a P-type. One N+ layer 74 is set opposite to the optical black 14. One end of the other N+ layer 72 is connected to an N++ layer 76 containing a higher concentration of an impurity than the N+ layer 72. The N++ layer 76 corresponds to the overflow drain 30 of FIG. 2. A P+ layer 78 of the same P-type as that of the semiconductor substrate 70 is formed on the surface thereof in connection to the other end of the N+ layer 72. Another P+ layer 78' is formed between and in connection to the end of the N+ layer 74 of the optical black 14 and the N++ layer connected to the N+ layer 72. The P+ layer 78 or 78' serves as a channel stopper of the area image sensor 10 of FIG. 3. A first insulation layer 80 is mounted on the semiconductor substrate 70 of the image-sensing area 12. Two metal layers 82, 84 are formed on the first insulation layer 80. One metal layer 82 is positioned above the junction of the N+ layer 72 and N++ layer 76. The metal layer 82 serves as the overflow control electrode 32 of FIG. 2. The other metal layer 84 is provided above the N+ layer 72 at a prescribed distance from the overflow control metal electrode 82, and acts as the gate electrode 25 of FIG. 2. Part of the first insulation layer 80 is so formed as to cover the overflow control metal electrode 82 and gate electrode 84. A metal layer 86 is formed on the first insulation layer 80 between the electrode layers 82, 84. Another metal layer 88 is formed on the remainder of the surface of the first insulation layer 80. Both end portions of the metal layer 86 respectively extend over the overflow control electrode layer 82 and gate electrode layer 84. The metal layer 86 serves as a storage electrode of the charge storage section corresponding to the sensitized section or photosensing section of FIG. 2. One end portion of said another metal layer 88 extends over the facing end of the gate electrode layer 84. The metal layer 88 serves as a transfer electrode of the vertical transfer element of FIG. 2. The first insulation layer 80 extends over that portion of the surface of the semiconductor substrate 70 which corresponds to the optical black 14. Another gate electrode layer 84' is mounted on said first insulation layer 80. A metal layer 90 is formed on that portion of the first insulation layer 80 which is included in the optical black 14, more particularly between the gate electrode 84' and the adjacent overflow control electrode 82 of a unit cell of the image sensing area 12. The electrode layer 90 takes the same shape as the storage electrode layer 86. A metal layer 92 is formed on that remaining portion of the surface of the first insulation layer 80 which faces the optical black 14. The metal layer 92 serves the same purpose as the storage electrode layer 86 of the image-sensing area 12.

As seen from FIG. 3, an opening 96 is formed above the overflow control electrode layer 82 of the image-sensing area 12, and an opening 98 is formed above the gate electrode 84 of said image-sensing area 12. An opening 98' is formed on the gate electrode 84' of the optical black 14.

A second insulation layer 100 is formed by the known process over the whole of the above-mentioned structure. A light shield layer 102 is formed on the other area of the surface of the second insulation layer 100 than that thereof which lies above the storage electrode 86 of the image-sensing area 12. The light shield layer 102 covers the cells of the optical black 14, and is prepared from metal to shut off an incoming light. Where, with the image sensor 10 constructed as described above, voltages impressed on the overflow control electrode layer 82, gate electrode layers 84, 84', storage electrode layers 86, 92 and transfer electrode layers 88, 90 are varied in level, then it is possible to freely control the depth of a potential well (not shown) produced below these electrode layers.

Description is now given with reference to FIGS. 1 to 3 of the operation of an image-sensing device according to one embodiment of this invention. When a shutter (not shown) is opened at the time of photographing, then an image light 104 (FIG. 3) illuminates the image-sensing area 12 of the image sensor 10 by being transmitted through a lens and shutter (not shown). Where the photosensing section of the image-sensing area 12 is exposed to the introduced light 104, signal charges corresponding to the luminosity of the introduced light 104 are produced in the semiconductor substrate 70. During this time, the signal generator 40 (FIG. 1) continues to send forth the storage control signal $\phi s$ to the storage electrode layer 86, thereby forming a potential well below the storage electrode layer 86. With a metal oxide semiconductor (MOS) capacitor formed of the storage electrode layer 86, first insulation layer 80 and semiconductor substrate 70, the potential well (storage region) is produced by eliminating majority carriers (holes in this embodiment). In this particular field of technology, a potential well is regarded as a sort of vessel, and minority carriers (electrons in this embodiment) are customarily considered as a sort of liquid partially filling said potential well vessel. Though a charge is actually stored in an interface, the charge is illustrated according to the above-mentioned model representation as a sort of liquid collected at the bottom of the potential well corresponding to the storage region under the storage electrode layer 86. This model representation is known to be very useful in describing the operation of the charge coupled device (CCD), and is applied also in this patent specification. Throughout FIGS. 4A to 4D, the charge is indicated by a hatching.

Figure 4A:
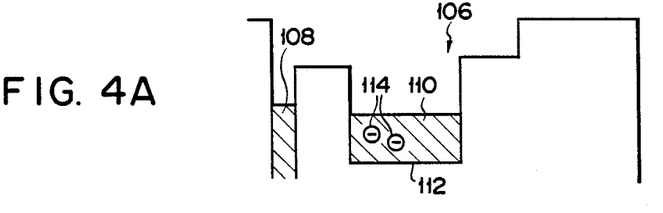
FIGS. 4A to 4D illustrate the steps of eliminating noise charges from a charge generated in the photosensing section of FIG. 3.

Referring to FIG. 4A, a pattern 106 denotes the potential distribution of a potential well produced when the signal generator 40 (FIG. 1) supplies signals $\phi o$, $\phi s$, $\phi g$ and $\phi t$ respectively to the overflow control electrode layer 82, storage electrode layer 86, gate electrode layer 84 and transfer electrode layer 88 included in a unit cell of the image-sensing area 12 of FIG. 3. At this time, the signal generator 40 sends forth signals φs, φg, φt respectively to the storage electrode layer 92, gate electrode layer 84′ and transfer electrode layer 90. As a result, a potential well formed in the optical black 14 has the same pattern as 106, but is not shown here.

Referring to FIG. 4A, a deep cavity 108 included in the pattern 106 denotes a potential well below the storage region. This deep cavity 108 corresponds to be N++ layer 76 of the overflow drain 30 (FIG. 2). A reference numeral 110 totally denotes light-generated signal charges which are stored in the storage section 112 of the MOS capacitor. Later when the shutter is closed, light introduction is stopped. While the charges 110 are stored for a prescribed length of time, thermally generated noise charges (dark current charges) 114 increase. These dark current charges 114 are carried into the regular signal charges 110 and stored in the storage section 112 together with said regular signal charges 110.

When the shutter is closed, light is shut off. At this time, the signal generator 40 supplies a gate signal φg to the gate electrode 23 (namely, the electrode layer 84′ of FIG. 3) of the optical black 14 (FIG. 2). As a result, dark current charges stored in the storage regions 18-1, 18-2, ..., 18-i of the optical black 14 are transmitted to the transfer elements 22-1, 22-2, ..., 22-i through the gate electrode 23. Thus, dark current charges in the vertical transfer section 20-1 are transmitted or transferred to the element 38-1 of the horizontal transfer section (CCD shift register) 16. The dark current charges are amplified by the amplifier 46. At this time, the signal generator 40 supplies a changeover instruction signal φc to the changeover switch 48, which in turn is closed on the side of the contact 56 (FIG. 1). As a result, amplified dark current charges are transmitted from the amplifier 46 to the control circuit 60 through the changeover switch 48. The operation circuit included in the control circuit 60 divides the voltage level of the dark current signals corresponding to the total amount of dark current charge generated in the optical black 14 by a number i of a plurality of storage regions 18-1, 18-2, ..., 18-i, thereby producing a voltage level of a signal corresponding to dark current charges issued from a single storage section. The control circuit 60 sends forth a charge release control signal φrc having a prescribed relationship to said signal voltage level. Later, the changeover switch 48 is thrown to the side of the contact 52.

Figure 4B:
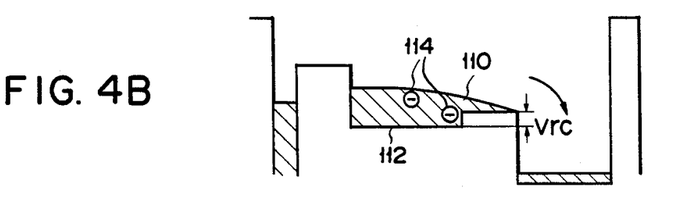
Figure 4C:
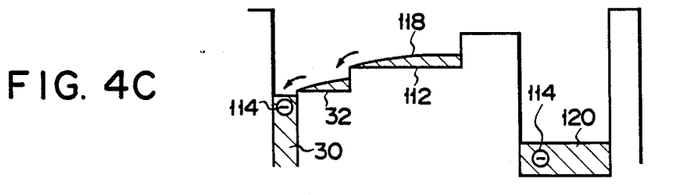
Figure 4D:
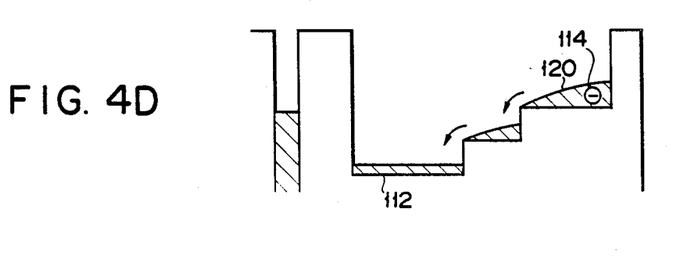

The charge release control signal φrc is delivered to the signal-superposing circuit 44, which superposes said charge release control signal φrc and an output gate signal φg from the signal generator 40 on each other. The resultant output signal φg′ is transmitted to the gate electrode 25 of the image-sensing area 12. At this time, the potential well of a cell included in the image-sensing area 12 changes as shown in FIG. 4B. Namely, the potential of a potential well under the gate electrode layer 84 is rendered higher by Vrc than that of the potential well of the storage region 112. This potential difference which is detected by the optical black 14 is taken to correspond to an amount of dark current charges which are assumed to have been thermally generated per cell. Referring to FIG. 4B, the potential well of the storage section has a smaller depth and the potential well of the transmission region has a correspondingly greater depth, according to the level of an output signal from the signal generator 40. As a result, charges (light-generated signal charges 110 and dark current charges 114) stored in the storage section 112 are introduced into the transfer region. Since, however, the potential well of the gate region has a potential Vrc higher, as previously mentioned, than that of the storage region, that portion of the charges which corresponds to said potential difference Vrc is still retained in the storage region 112. As shown in FIG. 4C, the retained charge 118 is transmitted to the overflow control electrode 32 and overflow drain 30 in succession. During this time, a charge group 120 (substantial signal charges) obtained after elimination of a charge corresponding to the dark current charge continues to be stored in the transfer region. Where . the retained charge 118 is fully eliminated by the overflow drain 30, namely, the N++ layer 76 of FIG. 3, then a substantial signal charges 120 stored in the transfer region are again introduced into the storage region 112 as shown in FIG. 4D. During the above-mentioned operation period, the potential of the potential wells of the respective regions vary with the levels of the overflow control signal φo, storage control signal φs, gate signal φg or φg′ and transfer control signal φt.

Figure 5A:
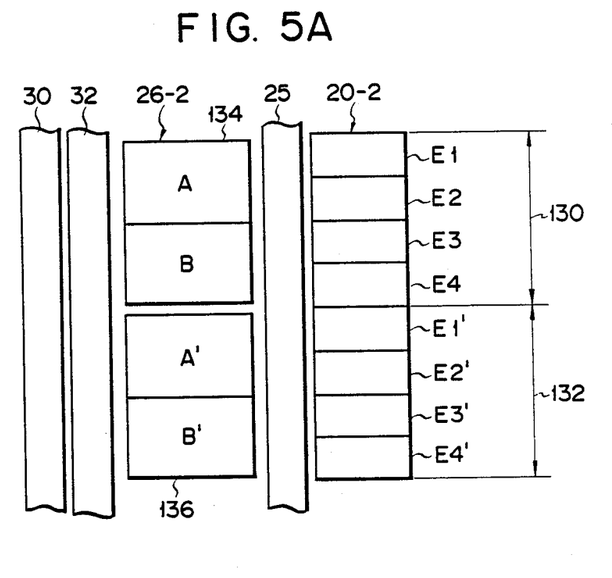
FIGS. 5A to 5E illustrate the manner in which signal charges are transferred according to one embodiment of this invention.
Figure 5B:
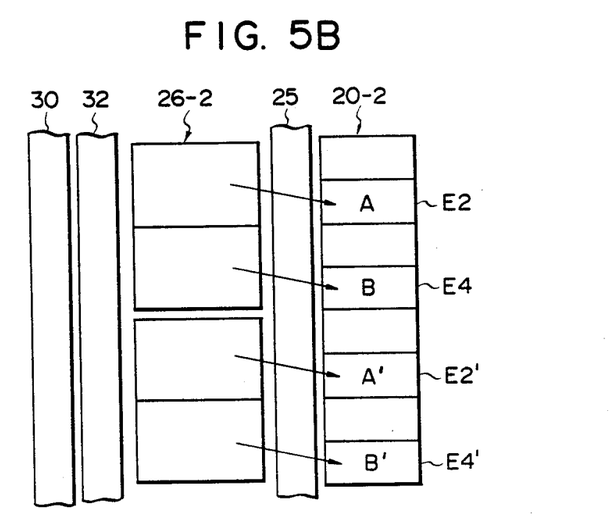
Figure 5C:
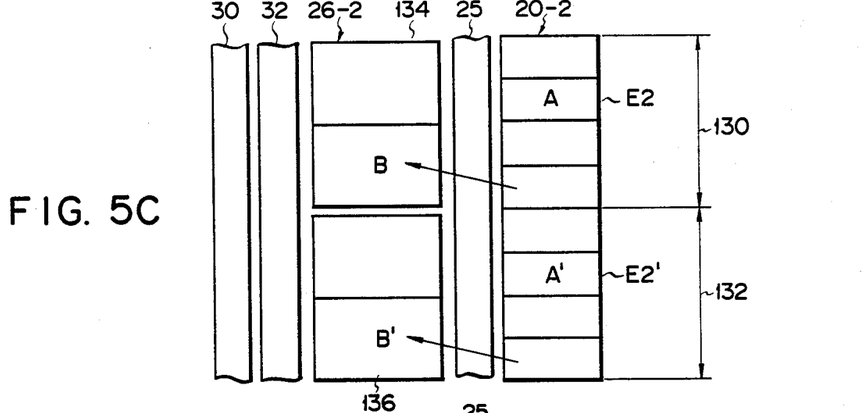
Figure 5D:
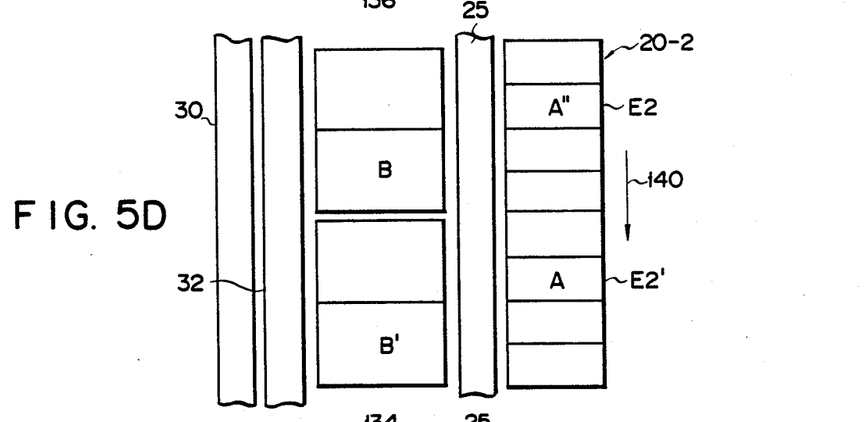
Figure 5E:
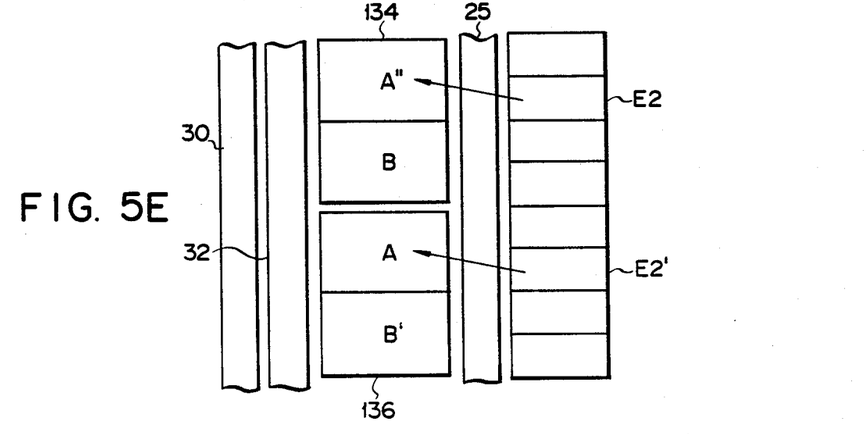

FIGS. 5A to 5E indicate in greater detail the manner in which charges are transmitted through the image-sensing area 12. FIG. 5A shows two unit cells 130, 132 constituting part of a group of cells (for example 26-2 of FIG. 2) included in the image-sensng area 12. The photosensing section 134 of the cell 130 has two picture elements, and the photosensing section 136 of the cell 132 also has two picture elements. The vertical transfer section 20-2 of the unit cell 130 comprises four divided transfer electrode components E1, E2, E3, E4, the former two of which correspond to one of two picture elements, and the latter two of which correspond to the other of said two picture elements. A signal charge generated in said one picture element is denoted by "A", and a signal charge generated in said other picture element is represented by "B". Similarly, the vertical transfer section 20-2 of the cell 132 comprises four divided transfer electrode components E1′, E2′, E3′, E4′, the former two of which correspond to one of another group of two picture elements, and the latter two of which correspond to the other of said group. A signal charge generated in said one picture element is denoted by "A'", and a signal charge generated in said other picture element is represented by "B'".

Where the image-sensing area 12 receives a light, then a light-generated charges 110 and dark current charges 114 are produced in the storage region of the sensitized section, as described with reference to FIG. 4A. FIG. 5A indicates the conditions of the unit cells 130, 132 at this time. Generated in the photosensing section 134 are two charge groups respectively containing the aforesaid signal charges 110 and dark current charges 114 (hereinafter referred to as "a first charge group A" and "a second charge group B"). Similarly generated in the sensitized section 136 are two charge groups respectively containing the aforesaid signal charge 110 and dark current charge 114 (hereinafter referred to as "a first charge group A'" and "a second charge group B'").

Where the potential well of each storage region changes as illustrated in FIG. 4B, the signal charge groups A, B, A′, B′ are respectively transmitted or transferred to the corresponding electrode components E2, E4, E2′, E4′ of the vertical transfer secton 20-2 through the gate 25. During this period, charges corresponding to the total amount of dark current charges are eliminated from the aforesaid charge groups A, B, A', B' as previously described with reference to FIG. 4B. Referring to FIG. 5C, only the charge groups B, B' of the vertical transfer section 20-2 are returned to the original picture elements of the photosensing section 26-2 in response to the aforesaid output signals from the signal generator 40. Referring to FIG. 5D, where a clock pulse is supplied to the vertical transfer section, then the first charge groups A, A' retained in the transfer section 20-2 are successively shifted in a direction indicated by an arrow 140. A charge group denoted by reference numeral A" in FIG. 5D represents a first charge group delivered from another cell positioned above the unit cell 130. This charge group A" is supplied to the transfer electrode component E2 of FIG. 5C where the charge group A is stored. A charge group A' of FIG. 5C is delivered to the electrode component E2' to be stored therein. Referring to FIG. 5E, the charge groups A", A are sent forth to the photosensing sections 134, 136 through the gate 25.

As a result, only the first charge groups A, A', A" which are generated in one of the two picture elements of the respective cells are transferred in the direction of the arrow 140. The second charge groups B, B' are substantially retained in the corresponding picture elements in which said second charge groups were originally generated. In the step of FIG. 5B part of the charges whose amount corresponds to that of the dark current charge is eliminated from the above-mentioned second charge groups B, B' as previously described. Consequently, signal charges substantially freed of noise components are held in a state shown in FIG. 5E of a given period of time.

Where the above-mentioned cycle of operation is repeated, then the first charge groups A, A', A" alone are transmitted to the horizontal transfer section 16 in the interline transfer CCD type image sensor 10 of FIG. 2. Said first charge groups A, A', A" are conducted through the horizontal transfer section 16 in synchronization with a prescribed radio frequency and are successively read out at the output terminal 54 (FIG. 1) through the changeover switch 48 which is now thrown to the side of the amplifier 46 and contact 52. The second charge groups B, B' are read out in succession to the first charge groups A, A', A". The foregoing description refers to the operation of a group of cells constituting one column. The same operation is simultaneously carried out by the groups of cells belonging to the other columns (not shown).

An image-sensing device according to the above-mentioned embodiment of this invention, comprises an optical black 14, that is, an area which has substantially the same arrangement as the image sensor 10, but does not receive a light. No signal charge is generated in a plurality of cells of the optical black 14 which are not supplied with a light. Only noise charges (dark current charges) are generated in the cells of the optical black 14 by some other causes, for example, thermally. An output signal denoting the total amount of said noise charges is read out of the optical black 14. The control circuit 60 determines an average value of noise charges per cell. This average value of noise charges is taken to correspond to an amount of noise charges supposedly generated in each cell and also is assumed to be equal to noise charges (dark current charges) which are regarded as objectionably present in charges collected in the storage region of the sensitized section of the image sensor 10. A gate signal $\phi g'$ corresponding to the amount of noise charges which should be eliminated is generated by the afore-mentioned operation, and supplied to the gate 25 provided in the image sensing area 12 of the image sensor 10. The potential of a potential well under the gate electrode layer 84 is controlled in accordance with the level of said gate signal. As a result, a charge equal to the amount of noise charges held in the storage region 112 (said charge includes part of a light-generated signal charges 110 and part of thermally generated dark current charges 114) is drawn off to the overflow drain 30. After the removal of said charge, the remaining charge still contains thermally generated dark current charges. As previously described, however, no substantial difference arises between the physical properties of the light-generated charge and those of the dark current charge, presenting no difficulties in reproducing an image. Elimination of noise components is simultaneously carried out over the whole of the image sensor 10.

A solid state image-sensing device embodying this invention has the advantages that even in the case of slow reading, noises can be reliably and easily eliminated from an image signal without applying any additional noise-removing means; an image signal is reproduced by reducing or preventing the effect of noises such as dark current by substantially the same process as is applied in the normal operation and high speed reading (for example with one field time usually set at 1/60 second and, in case of interlaced scanning, at 1/30 second) and simply by prolonging reading time as needed; noise components are reduced or eliminated throughout the area image sensor, thereby providing a high quality reproduced picture having a high S/N ratio; any additional noise-eliminating means need not be applied, rendering the subject image-sensing device simplified in arrangement and elevating the reliability of said device; the simplified arrangement of said device assures its miniaturization and the elevation of its operability.

Referring to the interlaced scanning in which one of the charge groups collected in the two picture elements of each cell is read out and during this time the other charge group is stored, the present invention offers the advantages that even when new dark current charges are carried into the other charge group which is stored for a relatively long length of time, harmful effects of the dark current can be reduced or suppressed by repeatedly carrying out the above-mentioned noise-eliminating operation, thereby providing a high quality reproduced picture even at slow reading.

Figure 6A:
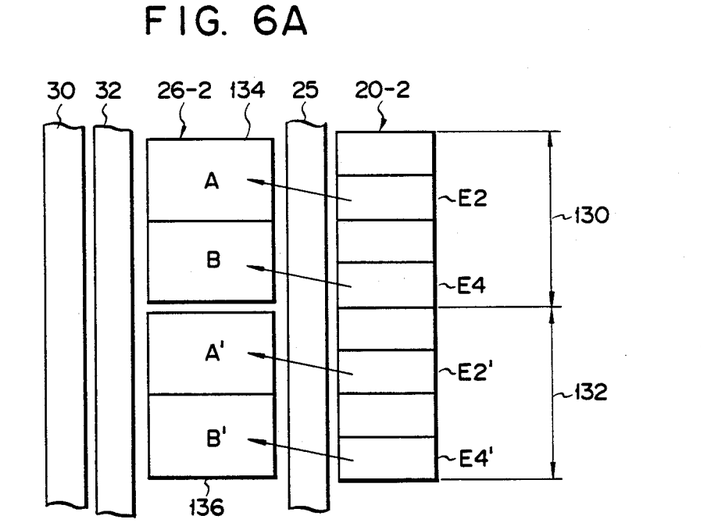
FIGS. 6A and 6B show steps modified from some of the steps (shown in FIGS. 5A to 5E) of transferring signal charges.

The step of reading charges from the image sensing area is not limited to the embodiment described with reference to FIGS. 5A to 5E. Referring to FIG. 5C, the second charge groups B, B' alone were returned to the photosensing section, after the charge groups A, B collected in the photosensing section 134 of the cell 130, and the charge groups A', B' collected in the photosensing section 136 of the cell 132 were transmitted or transferred to the vertical transfer section 20-2. However, as shown in FIG. 6A, it is possible to transfer all the charge groups A, A', B, B' to the photosensing section at the same time.

Figure 6B:
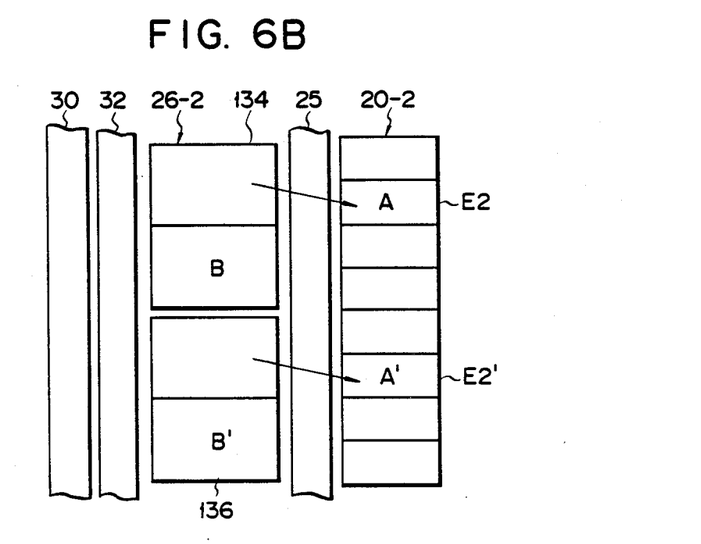

Later as indicated in FIG. 6B, the first charge groups A, A' are again transmitted respectively to the electrode components E2, E2' of the vertical transfer section 20-2. The subsequent steps are taken in the same manner as shown in FIGS. 5D and 5E, description thereof being omitted.

According to the above-mentioned modified operation, the charge groups A, A', B, B' generated in the photosensing section are transferred to the vertical transfer section 20-2 at the same time. At this time, an amount of charges corresponding to that of noise charges are eliminated. Thereafter, the charge groups A, A', B, B' are returned to the photosensing section at the same time. Then, for example, the first charge groups A, A' are read out by the ordinary interlaced scanning. Thus, the step of removing noises is separated from that of reading out a signal charge, thereby simplifying the control of noise elimination and enabling noises to be eliminated more uniformly.

Figure 7A:
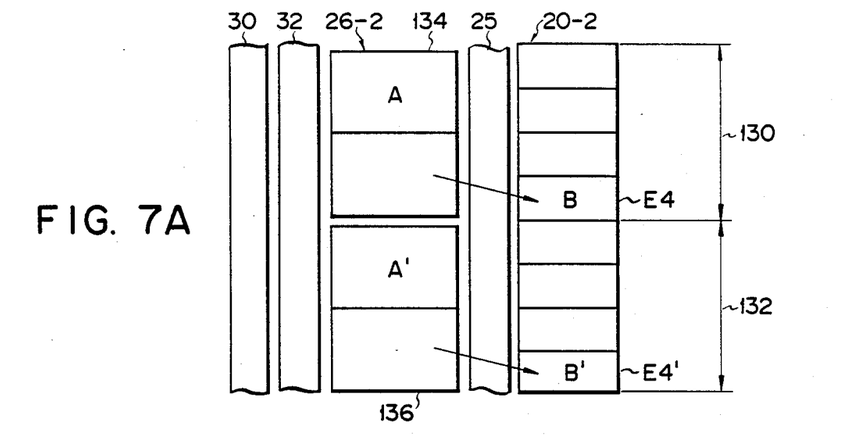
FIGS. 7A to 7E indicate steps further modified from those of FIGS. 5A to 5E.
Figure 7B:
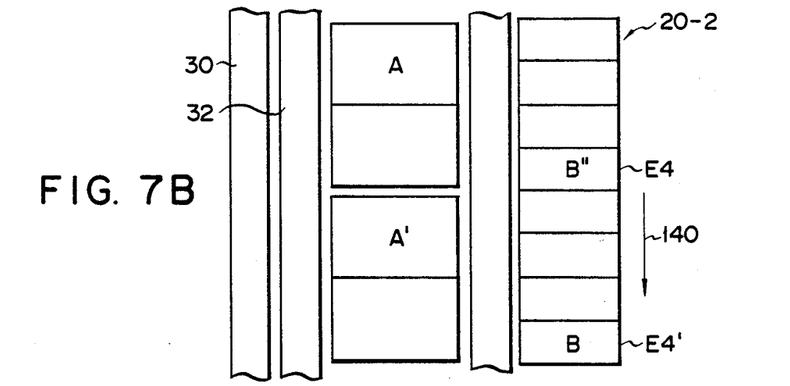
Figure 7C:
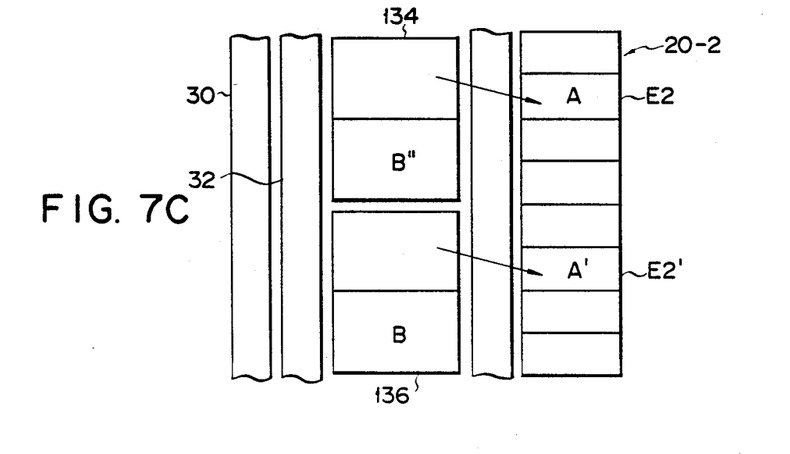
Figure 7D:
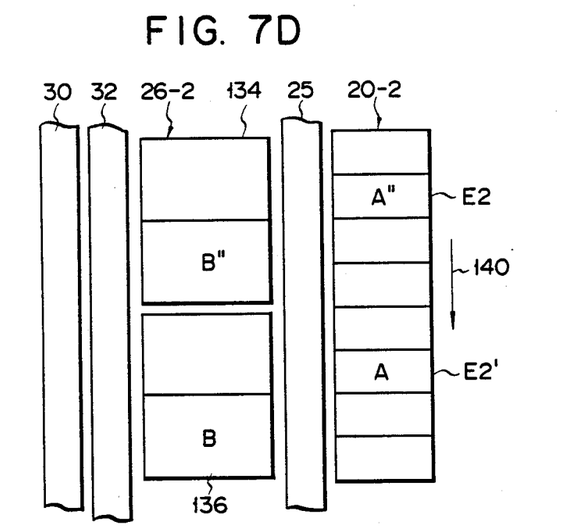
Figure 7E:
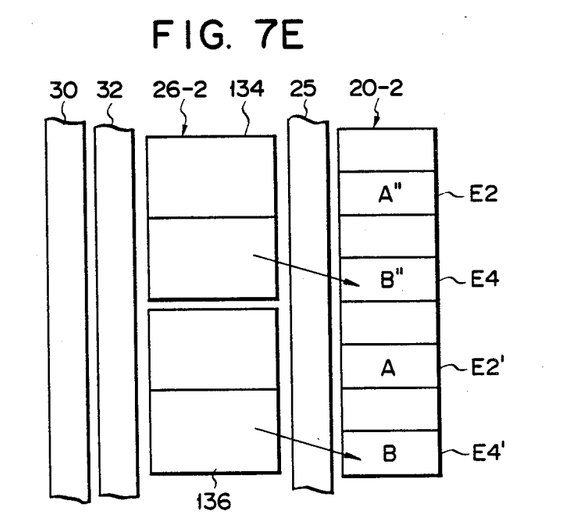

The charge-reading process of this invention need not be carried out restrictively by the above-mentioned interlaced scanning. Namely, it is possible to transmit or transfer, for example, the charge groups B, B' collected in the photosensing sections 134, 136 (FIG. 5A) respectively to the electrode components E4, E4' of the vertical transfer section 20-2 as indicated in FIG. 7A. In this case, noise components are also eliminated. Later, as shown in FIG. 7B, the second charge groups B, B' of the transfer section 20-2 are transferred in the direction of the arrow 140 in response to a clock pulse. Referring to FIG. 7C, the second charge groups B'', B (the reference numeral B'' denotes a charge delivered from another cell (not shown) positioned above the cell 130) are conducted to the photosensing section. The charge group B'' is initially brought into a picture element in which the charge group B is collected. The charge group B is transferred to the picture element in which the charge group B' is collected, while being displaced downward for one cell. Later, the first charge groups A, A' are respectively transferred to the electrode components E2, E2' (FIG. 7C). At this time, noise components are removed from the first charge groups A, A' as in the preceding case. The first charge groups A, A' are transferred through the vertical transfer section 20-2 in the direction of the arrow 140 (FIG. 7D). The charge group A is initially transferred to that portion of the vertical transfer section 20-2 in which the charge group A' was previously collected. Reference numeral A'' denotes a charge group delivered from a cell immediately preceding the unit cell 130 (not shown). Under the condition indicated in FIG. 7D, the second charge groups B'', B are supplied to the transfer section from the photosensing section. Where vertical transfer is carried out in this case, the first charge groups A, A', A'' and the second charge groups B, B', B'' are successively read out in alternate relationship.

Figure 8:
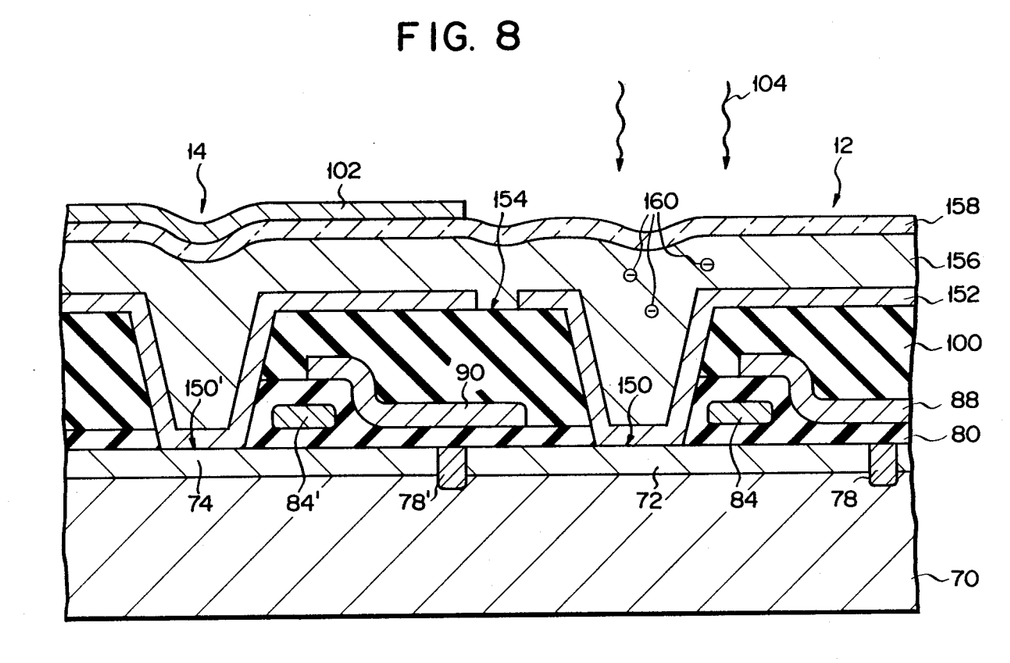
FIG. 8 is a sectional view of an image sensor used with a solid state image-sensing device according to another embodiment of this invention.

Description is now given of a solid state image-sensing device according to another embodiment of this invention, with reference to FIG. 8 showing the section of a cell included in the image-sensing area 12 and that of a cell included in the optical black 14. The parts of FIG. 8 the same as those of the preceding embodiment are denoted by the same reference numerals, description thereof being omitted. N+ layers 72, 74 are respectively provided on the surface of the semiconductor substrate 70 for the cell of the image-sensing area 12 and that of the optical black 14.

The N+ layers 72, 74 are alternately arranged. The channel stoppers 78, 78' alone are similarly alternately disposed between said alternately arranged N+ layers 72, 74 in connection thereto. An opening 150 is formed by the known process in that portion of the first insulation layer 80 mounted on the semiconductor substrate 70 which faces the storage region of the photosensing section of the image-sensing area 12. Similarly, an opening 150' is formed by the known process in that portion of the second insulation layer 100 which faces the storage region of the photosensing section of the image-sensing area 12. The openings 150, 150' penetrate both first and second insulation layers 80, 100. A metal layer 152 is formed on the second insulation layer 100 to extend over said first and second insulation layers 80, 100 jointly defining the openings 150, 150' and also over the surface of the semiconductor substrate 70. An opening 154 is formed in that portion of the metal layer 152 which faces a boundary between two adjacent cells. A photoelectric layer 156 is laid over the whole surface of the above-mentioned structure. Where the photoelectric layer 156 is exposed to a light, an electric charge is generated in said layer 156 in an amount corresponding to the luminosity of the introduced light. A transparent electrode layer 158 is stretched over the photoelectric layer 156. The afore-mentioned light shield layer 102 is mounted on that portion of the transparent electrode 158 which faces the optical black 14.

An image light 104 projected on the photosensing section of the image-sensing area 12 constructed as described above, is conducted into the photoelectric layer 156 through the transparent electrode 158. At this time, signal charges 160 are generated in the photoelectric layer 156 in an amount corresponding to the luminosity of the received light and stored in the PN junction defined by the N+ layer 72. During this period, a light is prevented from entering the optical black 14 by the light shield 102, causing no signal charge to be generated in said optical black 14. Signal charges 160 produced in the cells of the image-sensing area 12 are actually generated in a space defined between the transparent electrode 158 and metal layer 152 and moved along an electric field acting in a prescribed direction, for example, in the direction of the thickness of the photoelectric layer 156, and thereafter conducted to the storage region formed on the semiconductor substrate 70 through the afore-mentioned opening 150. The subsequent operation is carried out in the same manner as in the preceding embodiment, description thereof being omitted.

With the solid state image-sensing device according to a second embodiment of this invention which is provided with the above-mentioned sensitized section, a charge whose amount corresponds to that of a noise charge (dark current charge) is drawn off through the photoelectric layer 156 to the transparent electrode 158 by the supply of signals from the signal generator 40 (FIG. 1) to the transparent electrode 158. This arrangement eliminates the necessity of providing an overflow drain, and more simplifies the arrangement of the image sensor.

Although the present invention has been shown and described with respect to particular embodiments, nevertheless, various changes and modifications which are obvious to a person skilled in the art to which the invention pertains are deemed to lie within the spirit, scope and contemplation of the invention.

The embodiment of FIG. 2 applied the interlaced transfer CCD type image sensor. However, this invention is not limited to said application. It is possible to use, for example, a charge transfer device (CTD) type image sensor such as the BBD. The storage region of the photosensing section of the image-sensing area (FIG. 3) was formed of a MOS capacitor containing a storage electrode layer 86. However, said storage region may be formed of a PN junction. Referring to FIGS. 5A to 7E, charges were stored in the photosensing section 26-2. However, a charge may be stored in any of the vertical transfer section 20-2.

With the foregoing two embodiments, noise components were assumed to mainly consist of thermally generated dark current charges. However, the noise components are not limited to this type of charge, but obviously include any other type of charge acting as noises. Further, it is possible to apply a bias charge in addition to the light-generated signal charge and noise charge. This bias charge has a function of preventing a charge from being eliminated in a larger amount than necessary and suppressing the possibility of a signal charge being more reduced than required.

With the embodiment of FIG. 2, the optical black 14 was formed of a plurality of cells arranged in a single column at the end of the area image sensor 10. However, it is possible to form the optical black 14 of cells arranged in a plurality of columns. This arrangement assures a more accurate detection of noise charges.

What is claimed is:

1. A solid state image-sensing device which comprises:
  (a) a group of matrix-arranged cells, each of which includes means for generating signal charges corresponding to the luminosity of an introduced light, means which forms a potential well and stores therein mixed charges consisting of the second charges produced by said signal charge-generating means and first unnecessary noise charges;
  (b) detection means for detecting the amount of said noise charges stored in said charge-storing means and issuing a first electrical signal corresponding to the detected amount of said first noise charges;
  (c) elimination means in response to said first electrical signal for eliminating said first noise charges detected by said detection means from the mixed charges stored in said charge-storing means;
  (d) readout means connected at least to said matrix-arranged cell group for reading out the amount of the remaining portion of the mixed charges after removal of the first charge which equals said second charges; and
  (e) each of said cells further including transfer means for transferring the remaining portion of the mixed charges stored in said potential well of said charge-storing means and gate means which is disposed between said charge-storing means and transfer means to form a second potential well and freely move the remaining portion of the mixed charged between said charge-storing means and transfer means by varying the depth of said second potential well.

2. A solid state image-sensing device according to claim 1, wherein said transfer means and said readout means are each formed of a CTD type shift register.

3. A solid state image-sensing device according to claim 1, wherein said elimination means comprises:
  control means connected to said gate means which receives from said detection means said first electrical signal corresponding to the amount of said first noise charges and outputs a second electrical signal for determining the difference between the depths of the respective potential wells, said depth difference having a prescribed relationship with the first electrical signal, corresponding to the amount of the first charges and being defined by said charge-storing means and gate means of the respective cells, and the second electrical signal being supplied to said gate means coupled to said transfer means;
  means which is positioned at least apart from said charge-storing means to collect charges; and
  electrode means for transferring said first charges remaining in said charge-storing means to said charge-collecting means.

4. A solid state image-sensing device comprising:
  (a) a semiconductor substrate;
  (b) photosensing means, formed on said substrate, for receiving incident light introduced thereto and for forming a first potential well in which a group of charges are accumulated;
  (c) transfer means, formed on said substrate, for transferring said group of charges;
  (d) optically shielded optical black means, formed on said substrate, for outputting internally generated noise charges during the time said group of charges are accumulated;
  (e) first circuit means, connected to said optical black means, for determining the quantity of first charges which correspond to the quantity of noise charges generated by said optical black means and, generating an electrical signal which represents the quantity of said first charges; and
  (f) noise charge elimination means, connected to said first circuit means, for separating, at the time when said group of charges accumulated in said photosensing means are read out therefrom and read into said transfer means, said first charges from second charges of said group of charges in response to said electrical signal, and leaving said first charges behind in said photosensing means, for supplying to said transfer means said second charges which correspond to the luminosity of the light and are generated by said photosensing means in response to said incident light and, for eliminating said first charge from said photosensing means, said noise charge elimination means comprising drain means formed in said substrate and a second potential well whose depth is greater than that of the first potential well for collecting said first charges left behind in said photosensing means.

5. A solid state image-sensing device according to claim 4, which further comprises gate means formed between said photosensing means and said transfer means, for forming a third potential well whose level is variable and for shifting said second charges from said photosensing means to said transfer means; and wherein said noise charge elimination means further comprises:
  second circuit means, connected to said first circuit means and said gate means, for supplying in response to the electrical signal, a read out voltage to said gate means when said groups of charges are read out such that a difference between the depths of said first and third potential wells is established at the time said group of charges are read out and the quantity of charges accumulated in said first potential well becomes equal to the quantity of said first charges and the depth difference is not exceeded, the first depth being less than the third depth.

6. A solid state image-sensing device according to claim 5, wherein said drain means included in said noise charges elimination means includes a layer which is mounted on the surface of said substrate and which has the opposite conductivity type of that of said substrate with a high concentration of an impurity.

7. A solid state image-sensing device according to claim 5, wherein said noise charge elimination means further comprises:
   electrode means provided between said photosensing means and said drain means, for eliminating said first charges corresponding to unnecessary noise charges after said second charges have been transferred to said transfer means via the third potential well which is formed under said first gate means and is higher than the depth of the first potential well by said difference in depth.

8. A solid state image-sensing device according to claim 7, wherein said photosensing means includes photosensing cells arranged on said substrate in a matrix, said cells defining photosensing groups each having photosensing cells linearly aligned.

9. A solid state image-sensing device according to claim 8 wherein said optical black means comprises:
   at least one cell having substantially the same construction as any unit of said matrix-arranged cell group;
   a light shield means for preventing said one cell from being exposed to an introduced light.

10. A solid state image-sensing device according to claim 8, wherein said optical black means includes a photosensing group having i photosensing cells (i being a positive integer) which are optically shielded; and wherein said first circuit means divides the quantity of noise charges by i after receiving these noise charges from said optical black means, and determines the noise charge component generated by one cell of said optical black means, said component being substantially equal to the quantity of noise charges generated per photosensing cell included in said photosensing means.

11. A solid state image-sensing device according to claim 10 wherein said second charges delivered to the respective cells of said transfer means are returned at least once to said photosensing means by said gate means.

12. A solid state image-sensing device according to claim 10, wherein said noise charge elimination means comprises;
   switch means for supplying the noise charges generated by said photosensing group of said optical black means to said first circuit means at a prescribed point in time.

13. A solid state image-sensing device according to claim 12, wherein said noise charges contain at least thermally generated dark current charges.

* * * * *